(12) United States Patent
Zhang et al.

(10) Patent No.: US 11,894,442 B2
(45) Date of Patent: Feb. 6, 2024

(54) FULL NANOSHEET AIRGAP SPACER

(71) Applicant: International Business Machines Corporation, Armonk, NY (US)

(72) Inventors: Jingyun Zhang, Albany, NY (US); Ruilong Xie, Niskayuna, NY (US); Reinaldo Vega, Mahopac, NY (US); Kangguo Cheng, Schenectady, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 17/358,275

(22) Filed: Jun. 25, 2021

(65) Prior Publication Data

US 2022/0416056 A1    Dec. 29, 2022

(51) Int. Cl.
| | | |
|---|---|---|
| *H01L 29/66* | (2006.01) | |
| *H01L 29/06* | (2006.01) | |
| *H01L 29/786* | (2006.01) | |
| *H01L 29/423* | (2006.01) | |

(52) U.S. Cl.
CPC ...... *H01L 29/6653* (2013.01); *H01L 29/0653* (2013.01); *H01L 29/66545* (2013.01); *H01L 29/66553* (2013.01); *H01L 29/66742* (2013.01); *H01L 29/78696* (2013.01); *H01L 29/0665* (2013.01); *H01L 29/42392* (2013.01)

(58) Field of Classification Search
CPC ............. H01L 29/6653; H01L 29/0653; H01L 29/66545; H01L 29/66553; H01L 29/66742; H01L 29/78696; H01L 29/0665; H01L 29/42392; H01L 29/0673; H01L 29/775; H01L 29/66439; B82Y 10/00

USPC ......................................................... 257/386
See application file for complete search history.

(56) References Cited

U.S. PATENT DOCUMENTS

| | | |
|---|---|---|
| 9,853,132 B2 | 12/2017 | Cheng |
| 9,954,058 B1 | 4/2018 | Mochizuki |
| 10,553,696 B2 | 2/2020 | Ando |
| 10,692,991 B2 | 6/2020 | Chanemougame |
| 10,910,470 B1 | 2/2021 | Wu |
| 10,971,585 B2 | 4/2021 | Lee |
| 2018/0331232 A1 | 11/2018 | Frougier |
| 2020/0083352 A1* | 3/2020 | Chanemougame ......... H01L 29/6681 |
| 2021/0151556 A1 | 5/2021 | Wu |

OTHER PUBLICATIONS

"Patent Cooperation Treaty PCT Notification of Transmittal of the International Search Report and the Written Opinion of the International Searching Authority, or the Declaration", International application No. PCT/EP2022/066654, International filing date Jun. 20, 2022 (Jun. 20, 2022), dated Oct. 10, 2022 (Oct. 10, 2022), 17 pages.

\* cited by examiner

*Primary Examiner* — Tong-Ho Kim
(74) *Attorney, Agent, or Firm* — Gavin Giraud

(57) ABSTRACT

Embodiments disclosed herein include a nanosheet transistor for reducing parasitic capacitance. The nanosheet transistor may include a spacer region between a high-k metal gate and an epitaxial layer. The spacer region may include a first nanosheet stack with a first nanosheet and a second nanosheet. The spacer region may include an inner spacer region between the first nanosheet and the second nanosheet, and a side subway region located along an edge of the first nanosheet, the inner spacer region, and the second nanosheet.

20 Claims, 18 Drawing Sheets

FULL NANOSHEET AIRGAP SPACER

BACKGROUND

The present invention relates generally to the field of semiconductor device manufacturing, and more particularly to fabricating a nanosheet transistor with a stacked air gap between stacked sheets and a side subway air gap along an edge.

As semiconductor microchips and integrated circuits become smaller, vertically stacked semiconductor nanosheets are increasingly being used. Nanosheets are two-dimensional nanostructures in which the vertical thickness is substantially less than the width. Semiconductor nanosheets are seen as a feasible option for reducing the size of semiconductor devices. Vertically stacked semiconductor nanosheets provide area efficiency and can provide increased drive current within a given layout.

The general process flow for semiconductor nanosheet formation involves the formation of a material stack that contains sacrificial layers of silicon germanium between silicon nanosheets. After removing the sacrificial layers, vertically stacked and suspended silicon nanosheets are provided. A functional gate structure can be formed above and below each silicon nanosheet.

SUMMARY

Aspects of an embodiment of the present invention include a nanosheet transistor for reducing parasitic capacitance. The nanosheet transistor may include a spacer region between a high-k metal gate and an epitaxial layer. The spacer region may include a first nanosheet stack with a first nanosheet and a second nanosheet. The spacer region may include an inner spacer region between the first nanosheet and the second nanosheet, and a side subway region located along an edge of the first nanosheet, the inner spacer region, and the second nanosheet.

Aspects of an embodiment of the present invention include methods of fabricating a nanosheet transistor. The methods may include forming a nanosheet stack comprising sacrificial inner spacers and nanosheets, forming an epitaxial layer adjacent to the nanosheet stack, indenting the epitaxial layer to expose the sacrificial inner spacer at a corner etch, and removing the sacrificial inner spacer to form an air gap around the nanosheets.

Aspects of an embodiment of the present invention include a nanosheet transistor for reducing parasitic capacitance. The nanosheet transistor may include a spacer region between a high-k metal gate and an epitaxial layer. The spacer region may include a first nanosheet stack comprising a first nanosheet and a second nanosheet and an inner spacer region between the first nanosheet and the second nanosheet. The inner spacer region may include an air gap over a width of the first nanosheet and the second nanosheet.

DETAILED DESCRIPTION

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which transistor devices are fabricated.

Improvements in the design of transistor devices have enabled feature sizes to enter into deep submicron and nanometer regime. These smaller feature sizes, however, can cause otherwise minor issues to have more detrimental effect on the operation of the transistor device. For example, parasitic capacitance, especially a fringing parasitic capacitance between a gate and a source/drain, may account for a higher proportion of the total capacitance in smaller transistor devices. A high proportion of parasitic capacitance can result in a severe influence on the transient response of the device.

To reduce parasitic capacitance, transistor devices can include spacers made of materials with low dielectric constants in designated areas. In certain embodiments, the spacers may be formed using air gaps, since air has a very low dielectric constant. If the air gaps are not formed properly, however, then any benefit the air provides may be unrealized. For example, if epitaxially grown source/drain regions grow into the air gap region, then the transistor device will suffer decreased performance. The embodiments described below, therefore, include a spacer region that has an air gap formed after the epitaxial regions are grown.

Figure 1:
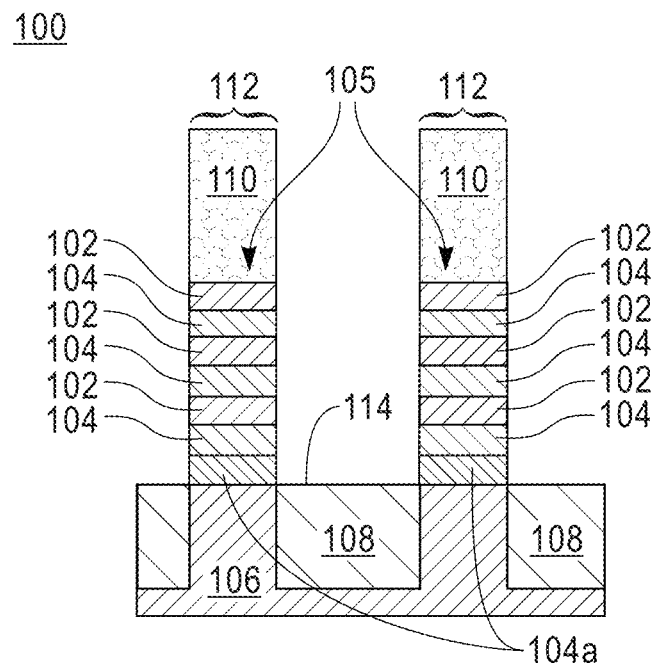
FIG. 1 depicts a nanosheet transistor at a fabrication stage of the processing method, in accordance with one embodiment of the present invention.

FIG. 1 depicts a nanosheet transistor 100 at a fabrication stage of the processing method, in accordance with one embodiment of the present invention. The nanosheet transistor 100 includes nanosheets 102 and sacrificial semiconductor layers 104 that are formed in an alternating series as a vertical layer stack 105 on a substrate 106. The substrate 106 includes a shallow trench isolation 108, which may be the buried oxide (BOX) layer of a semiconductor-on-insulator (SOI) substrate or dielectric isolation in a bulk substrate. The nanosheets 102 (i.e., nanosheets or nanowires) may be composed of a semiconductor material, such as silicon (Si). The sacrificial semiconductor layers 104 may be composed of a semiconductor material, such as silicon germanium (SiGe). The nanosheets 102 and the sacrificial semiconductor layers 104 may be formed by an epitaxial growth process, and at least the sacrificial semiconductor layers 104 may be undoped. The semiconductor material of the sacrificial semiconductor layers 104 is selected to be removed cleanly from the semiconductor material of the nanosheets 102. As used herein, the term "cleanly" in reference to a material removal process (e.g., etching) denotes that, with an appropriate etchant choice, the material removal rate (i.e., etch rate) for the targeted material is greater than the removal rate for at least another material exposed to the material removal process. The sacrificial semiconductor layers 104 may include a bottom sacrificial semiconductor layer 104a that has a different silicon germanium ratio that enables a fabrication operator to cleanly remove the bottom sacrificial layer 104a without removing the other sacrificial semiconductor layers 104 or the nanosheets 102. The number of nanosheets 102 and sacrificial semiconductor layers 104 may differ (more layers or fewer layers) from the number depicted in the representative embodiment.

A hardmask 110 is formed on the top surface of the layer stack 105 that includes the nanosheets 102 and the sacrificial semiconductor layers 104. The hardmask 110 may be composed of a hardmask material, such as silicon nitride, that is deposited (e.g., by chemical vapor deposition (CVD)) and patterned using a litho patterning process. The patterning enables the nanosheet transistor 100 to be formed as a fin 112, where the nanosheets 102 and the sacrificial semiconductor layers 104 are a trimmed layer stack 105 with alternating sections of the nanosheets 102 and sacrificial semiconductor layers 104. The fin 112 projects in a vertical direction relative to a major surface 114 of the shallow trench isolation 108. The hardmask 110 furnishes as an etch mask during the etching process forming the fin 112.

Figure 2:
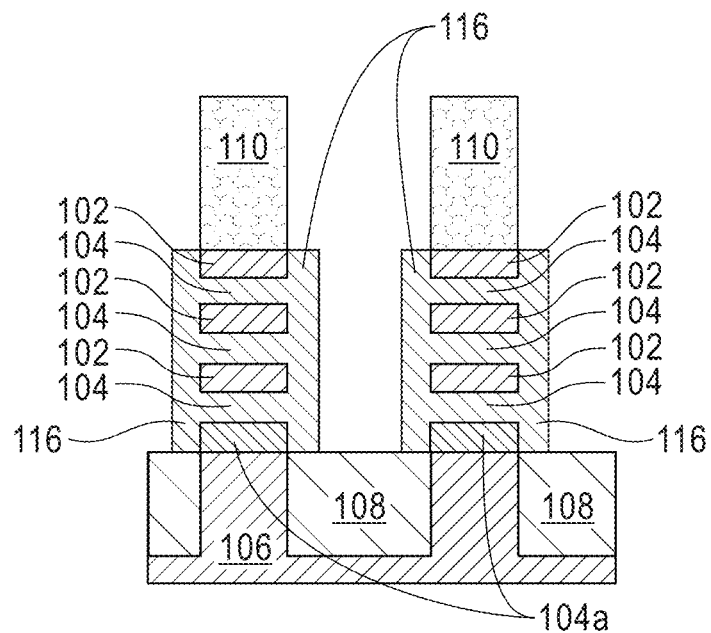
FIG. 2 depicts a cross-sectional side view of the nanosheet transistor of FIG. 1, with like reference numerals referring to like features and at a subsequent fabrication stage of the processing method.

FIG. 2 depicts a cross-sectional side view of the nanosheet transistor 100 of FIG. 1, with like reference numerals referring to like features and at a subsequent fabrication stage of the processing method. In FIG. 2, the nanosheet transistor 100 has side sacrificials 116 formed on either side of the fin 112. The side sacrificials 116 may be formed using atomic layer deposition (ALD) and anisotropic etch. Additionally or alternatively, the side sacrificials 116 may be formed epitaxially. The side sacrificials 116 may be formed using the same material as the sacrificial semiconductor layers 104. For example, the side sacrificials 116 and the sacrificial semiconductor layers 104 may be formed with silicon germanium having the same percentage of germanium (e.g., 25 percent, 30 percent, 35 percent, 40 percent, or 45 percent). The bottom sacrificial semiconductor layer 104a may also include silicon germanium, but may include a different percentage (e.g., 50 percent, 55 percent, 60 percent, 65 percent, or 70 percent). The side sacrificials 116 may also be formed using different material from the sacrificial semiconductor layer 104.

Figure 3:
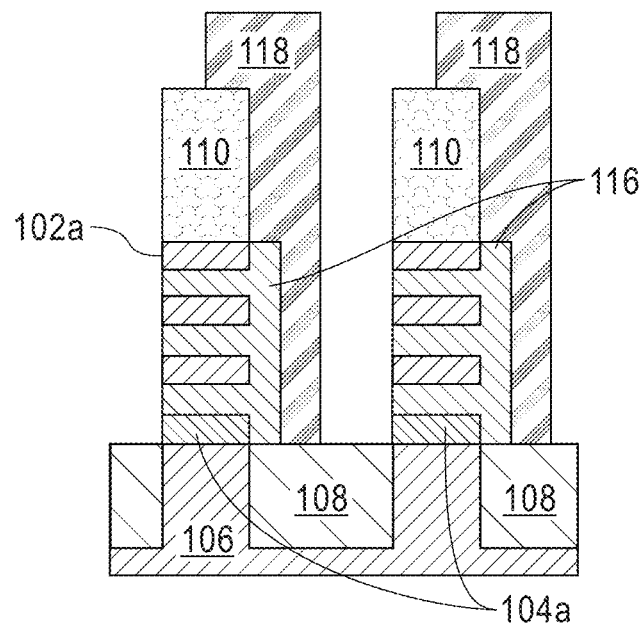
FIG. 3 depicts a cross-sectional side view of the nanosheet transistor of FIG. 1, with like reference numerals of previous figures referring to like features and at a subsequent fabrication stage of the processing method.

FIG. 3 depicts a cross-sectional side view of the nanosheet transistor 100 of FIG. 1, with like reference numerals of previous figures referring to like features and at a subsequent fabrication stage of the processing method. In FIG. 3, the nanosheet transistor 100 has a blocking mask 118 that protects one side sacrificial 116 per fin 112 while the other side sacrificial 116 is etched. Etching one side sacrificial 116 exposes the nanosheets 102 and the sacrificial semiconductor layers 104 on a first edge 120a. The material of 118 could be conventional organic thin films used in lithography process, such as OPL.

Figure 4:
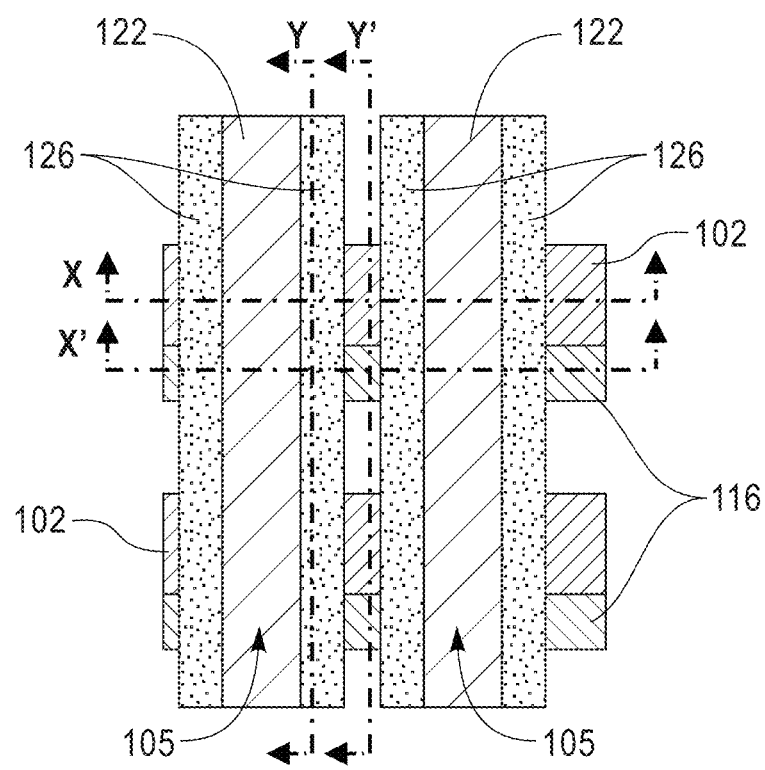
FIG. 4 depicts a schematic top view of the nanosheet transistor at the fabrication stage of FIG. 7, with like reference numerals of previous figures referring to like features.
Figure 7:
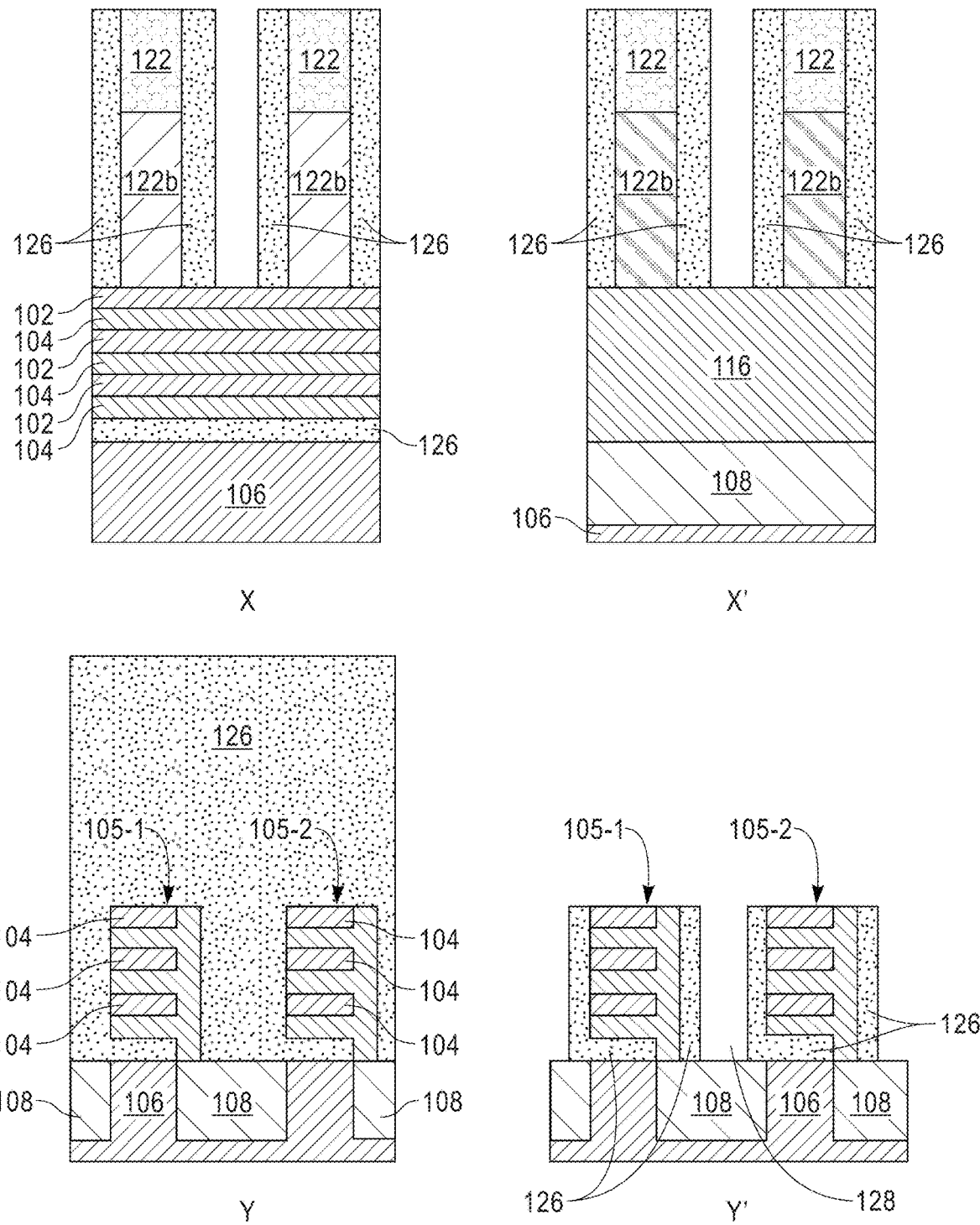

FIG. 4 depicts a schematic top view of the nanosheet transistor 100 at the fabrication stage of FIG. 7, with like reference numerals of previous figures referring to like features. FIG. 4 also illustrates cross-sectional lines, namely X, X', Y, and Y', that indicate the cross-sectional views for subsequent figures described in this application. The X and X' lines indicate cross-sectional views along the x-axis, while the Y and Y' lines indicate cross-sectional views along the y-axis. The X cross-sectional view is lengthwise along the stack 105 of nanosheets 102 and sacrificial layers 104. The X' cross-section view is lengthwise along the side sacrificial 116 that will eventually become a side subway region. The Y cross-sectional view is widthwise across the stack 105 of nanosheets 102 and sacrificial layers 104 under the gate spacer region (and is the cross-sectional view of FIGS. 1-3). The Y' cross-sectional view is also widthwise, but at a location that will eventually be source/drain regions of the devices as shown in detail below.

Figure 5:
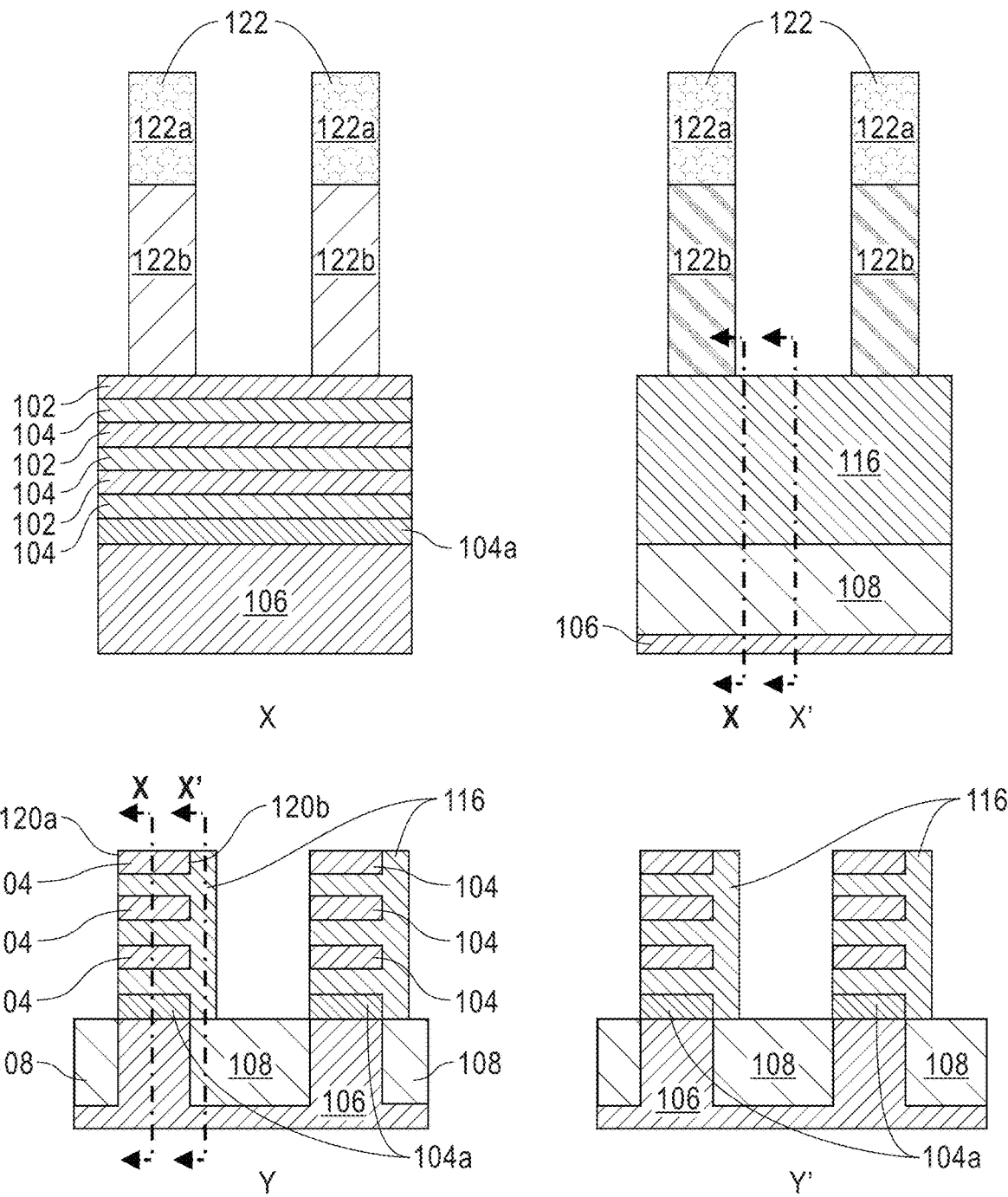
FIGS. 5-20 depict four cross-sectional side views of the nanosheet transistor at the locations indicated in FIG. 4, with like reference numerals of previous figures referring to like features, and at a fabrication stage of the processing method that is subsequent to the directly previous figure.

FIG. 5 depicts four cross-sectional side views of the nanosheet transistor 100 at the locations indicated in FIG. 4, with like reference numerals of previous figures referring to like features, and at a fabrication stage of the processing method that is subsequent to FIG. 3. FIG. 5 also includes cross-sectional lines in the X' figure indicating the location for the Y and Y' cross-sections, and cross-sectional lines in the Y figure indicating the location for the X and X' cross-sections. In FIG. 5, the blocking mask 118 and the nanosheet hardmask 110 have been removed. The nanosheet transistor 100 now includes a dummy gate structure 122 having a top hard mask 122a and a bottom dummy gate structure 122b (i.e., only shown in the X and X' subfigures). The dummy gate structure 122 may be formed from hard mask materials of any variety, since the dummy gate structure 122 is removed before fabrication of the nanosheet transistor 100 is completed. The bottom dummy gate structure 122b may include a thin silicon oxide layer followed by amorphous silicon that is patterned by conventional litho and etch process.

Figure 6:
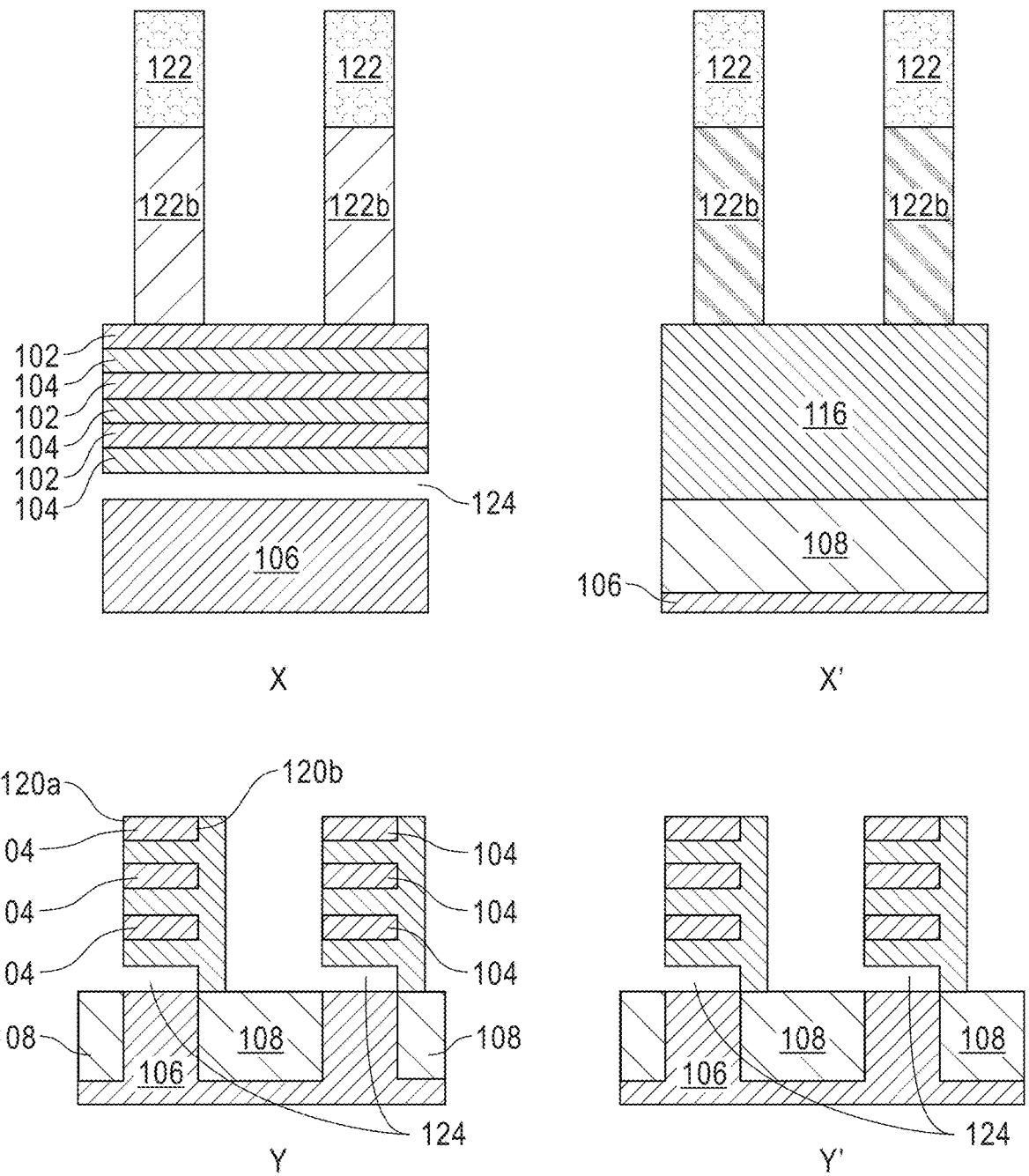

FIG. 6 depicts four cross-sectional side views of the nanosheet transistor 100 at the locations indicated in FIG. 4, with like reference numerals of previous figures referring to like features, and at a fabrication stage of the processing method that is subsequent to FIG. 5. FIG. 6 also includes a gap 124 where the bottom sacrificial semiconductor layer 104a has been etched cleanly from the substrate 106, the side sacrificial 116, and the remaining sacrificial semiconductor layers 104. The nanosheets 102 and sacrificial semiconductor layers 104 are held in place at a second edge 120b by the side sacrificial 116, which is attached to the shallow trench isolation 108.

FIG. 7 depicts four cross-sectional side views of the nanosheet transistor 100 at the locations indicated in FIG. 4, with like reference numerals of previous figures referring to like features, and at a fabrication stage of the processing method that is subsequent to FIG. 6. FIG. 7 also includes a spacer dielectric 126 (e.g., silicon oxide, silicon nitride) formed around the dummy gate structure 122 and around the stacks 105 of nanosheets 102 and sacrificial semiconductor layers 104. The spacer dielectric 126 forms under the sacrificial semiconductor layer 104 as well, in the location where the bottom sacrificial layer 104a had been before being removed. As shown in subfigure Y', the spacer dielectric 126 does not fill all of an interlayer dielectric area 128 between the first stacks 105-1 and the second stacks 105-2. In the regions directly around the dummy gate structure 122, however, the space between the stacks 105 is filled with spacer dielectric 126.

Figure 8:
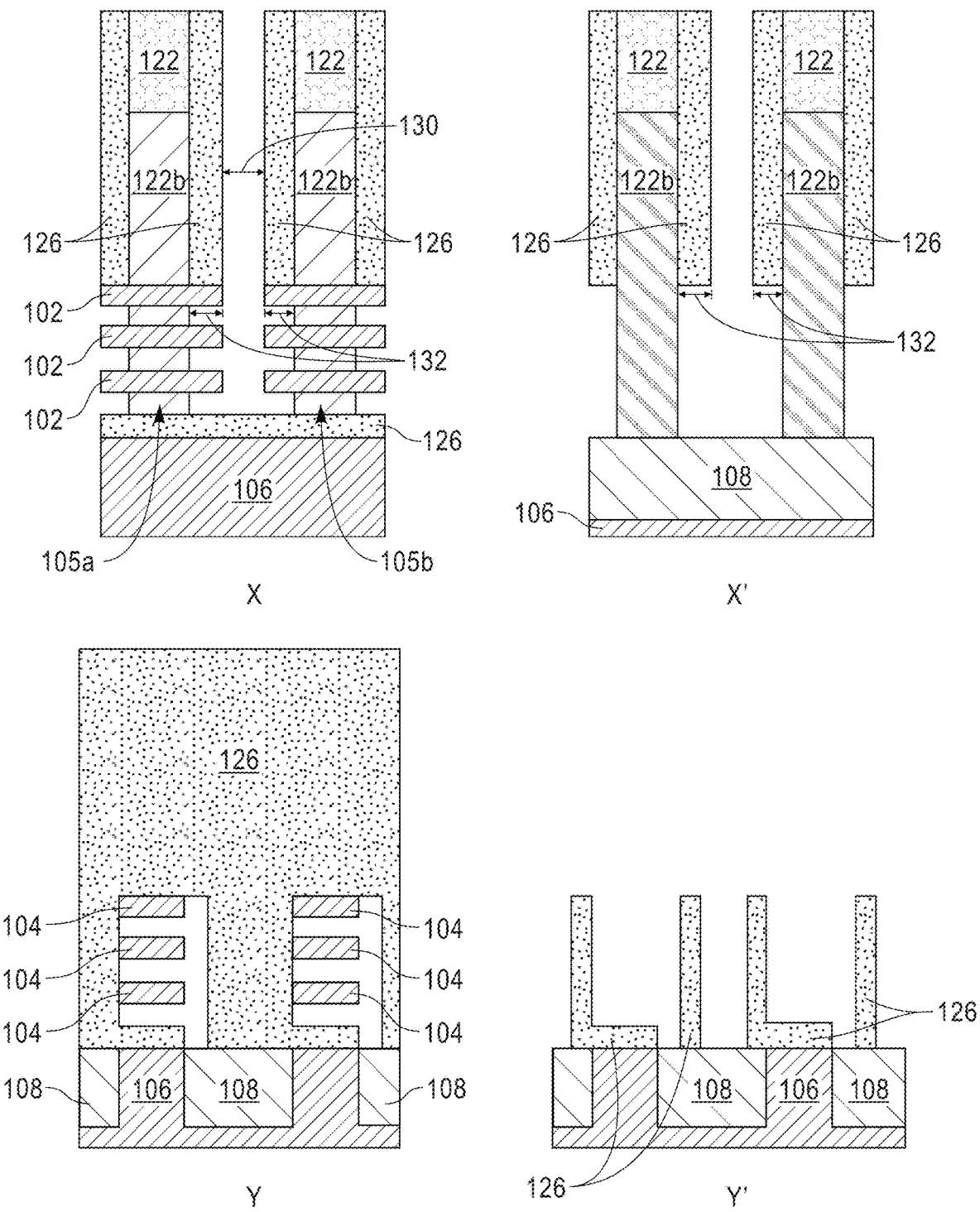

FIG. 8 depicts four cross-sectional side views of the nanosheet transistor 100 at the locations indicated in FIG. 4, with like reference numerals of previous figures referring to like features, and at a fabrication stage of the processing method that is subsequent to FIG. 7. FIG. 8 illustrates segmentation of the fin 112, and the indentation of the sacrificial semiconductor layers 104. The fin 112 is segmented when the entire stack 105 (nanosheets 102, sacrificial semiconductor layers 104, and side sacrificials 116) is etched down to the major surface 114 of the substrate 106 and the shallow trench isolation 108 in the areas between the dummy gate structures 122, as shown in subfigure Y'. This segmentation creates a separation 130 between a first stack 105a and a second stack 105b (see subfigure X). The nanosheets 102 under the spacer dielectric 126 between the stacks 105a/105b are not etched, but the sacrificial semiconductor layers 104 are indented an indentation distance 132 that corresponds to the thickness of the spacer dielectric 126 covering the dummy side structure 122. The side sacrificial 116 under the dummy gate structure 122 is etched the indentation distance 132, but is not etched completely, as shown in subfigure X'.

Figure 9:
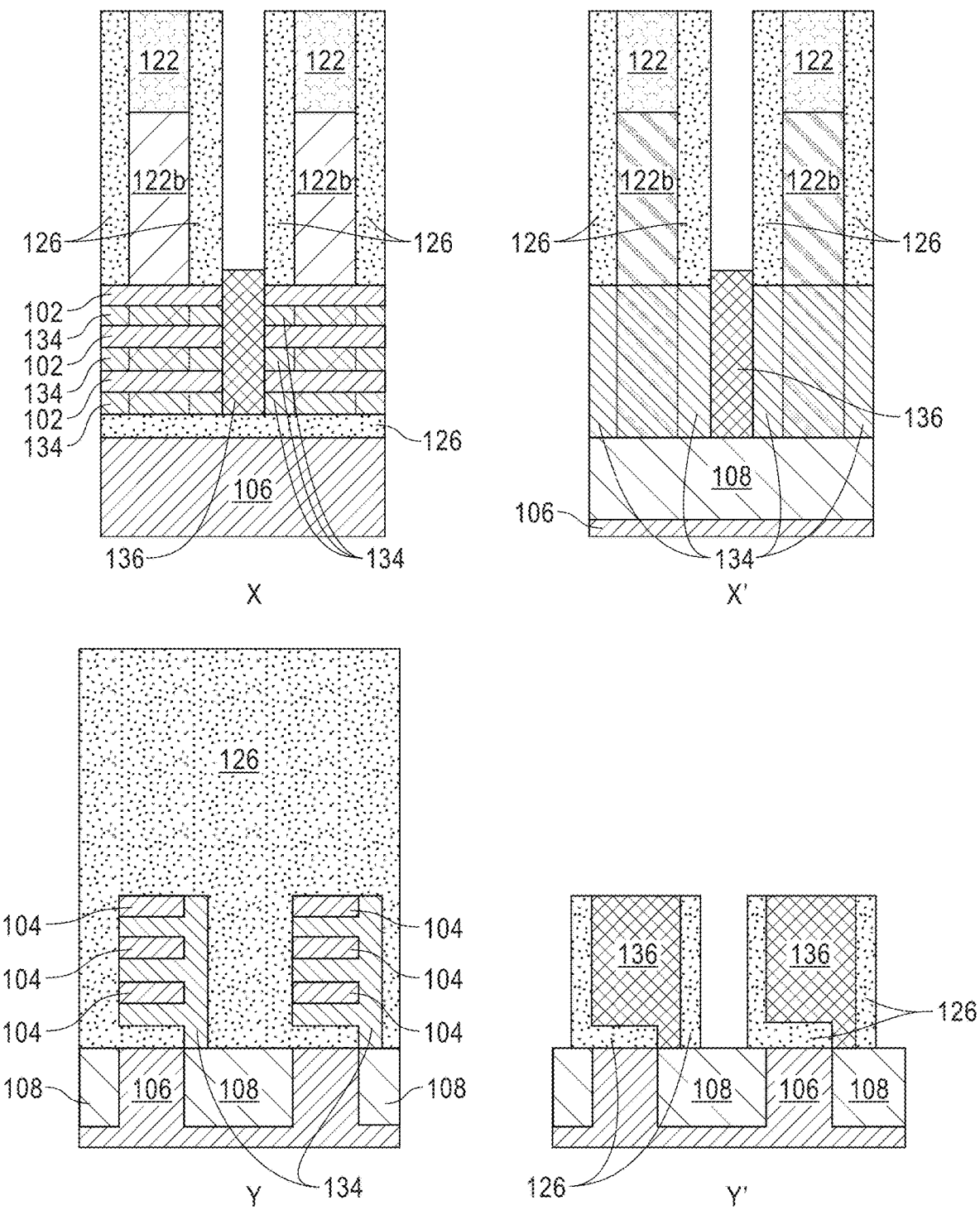

FIG. 9 depicts four cross-sectional side views of the nanosheet transistor 100 at the locations indicated in FIG. 4, with like reference numerals of previous figures referring to like features, and at a fabrication stage of the processing method that is subsequent to FIG. 8. FIG. 9 shows the formation of a sacrificial inner spacer 134, and the growth of the epitaxial layer 136. The sacrificial inner spacer 134 may include titanium oxide, titanium nitride, or other materials and are formed around where the sacrificial semiconductor layers 104 were indented. After the sacrificial inner spacer 134 is formed, then the epitaxial layer 136 is formed between stack 105a and stack 105b.

Figure 10:
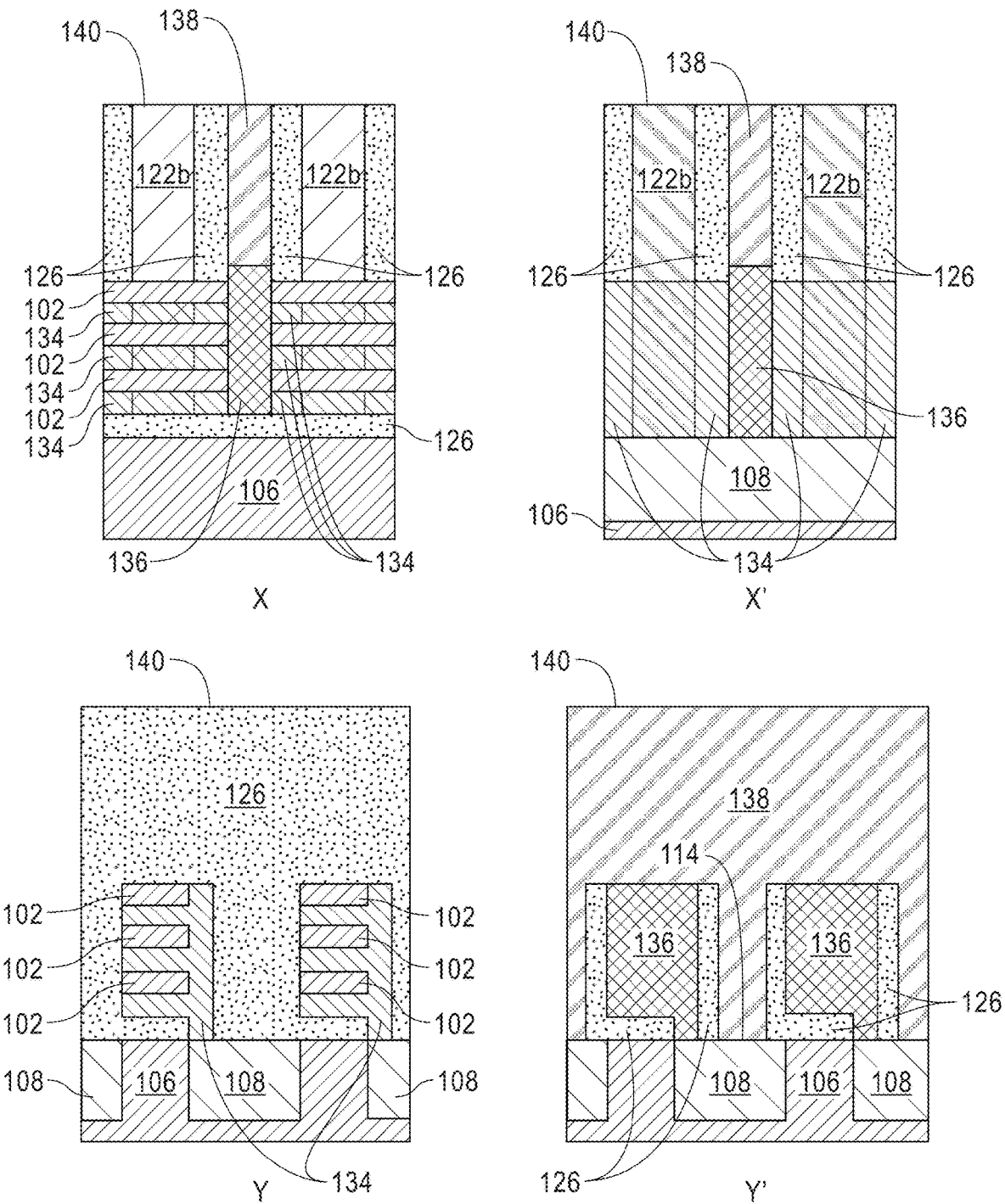

FIG. 10 depicts four cross-sectional side views of the nanosheet transistor 100 at the locations indicated in FIG. 4, with like reference numerals of previous figures referring to like features, and at a fabrication stage of the processing method that is subsequent to FIG. 9. FIG. 10 shows the deposition of an interlayer dielectric (ILD) 138 (e.g., silicon oxide, other dielectric materials). The ILD 138 is deposited between the dummy gate structures 122 in some areas over the epitaxial layer 136 (see subfigures X and X') and in some areas over the major surface 114 (see subfigure Y'). The nanosheet transistor 100 is then planarized to a poly surface 140. The poly surface 140 is located at a level so that the bottom dummy gate structure 122b is exposed.

Figure 11:
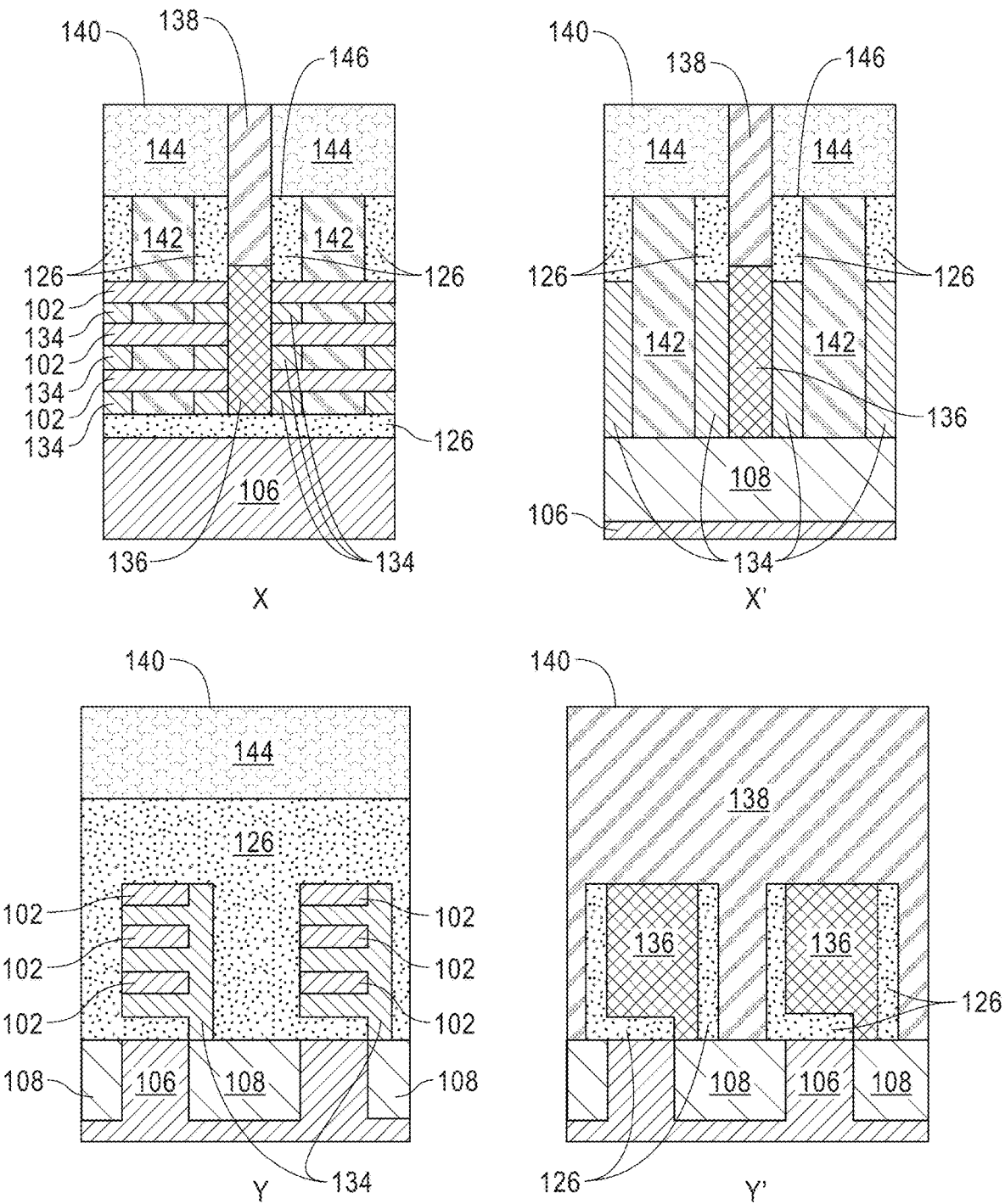

FIG. 11 depicts four cross-sectional side views of the nanosheet transistor 100 at the locations indicated in FIG. 4, with like reference numerals of previous figures referring to like features, and at a fabrication stage of the processing method that is subsequent to FIG. 10. FIG. 11 shows a stage in which the dummy gate structure 122 (i.e., the bottom dummy gate structure 122b) has been removed completely; the sacrificial semiconductor layer 104, the side sacrificials 116 have been released; and a high-k metal gate (HKMG) stack 142 has replaced the sacrificial semiconductor layer 104, the side sacrificials 116, and a portion of the bottom dummy gate structure 122b. After replacement of the HKMG stack 142, the top portion of the HKMG stack 142, including the spacer dielectric 126 are recessed, and re-filled with dielectric capping material 144 (i.e., a self-aligned contact cap or sacrificial cap).

Figure 12:
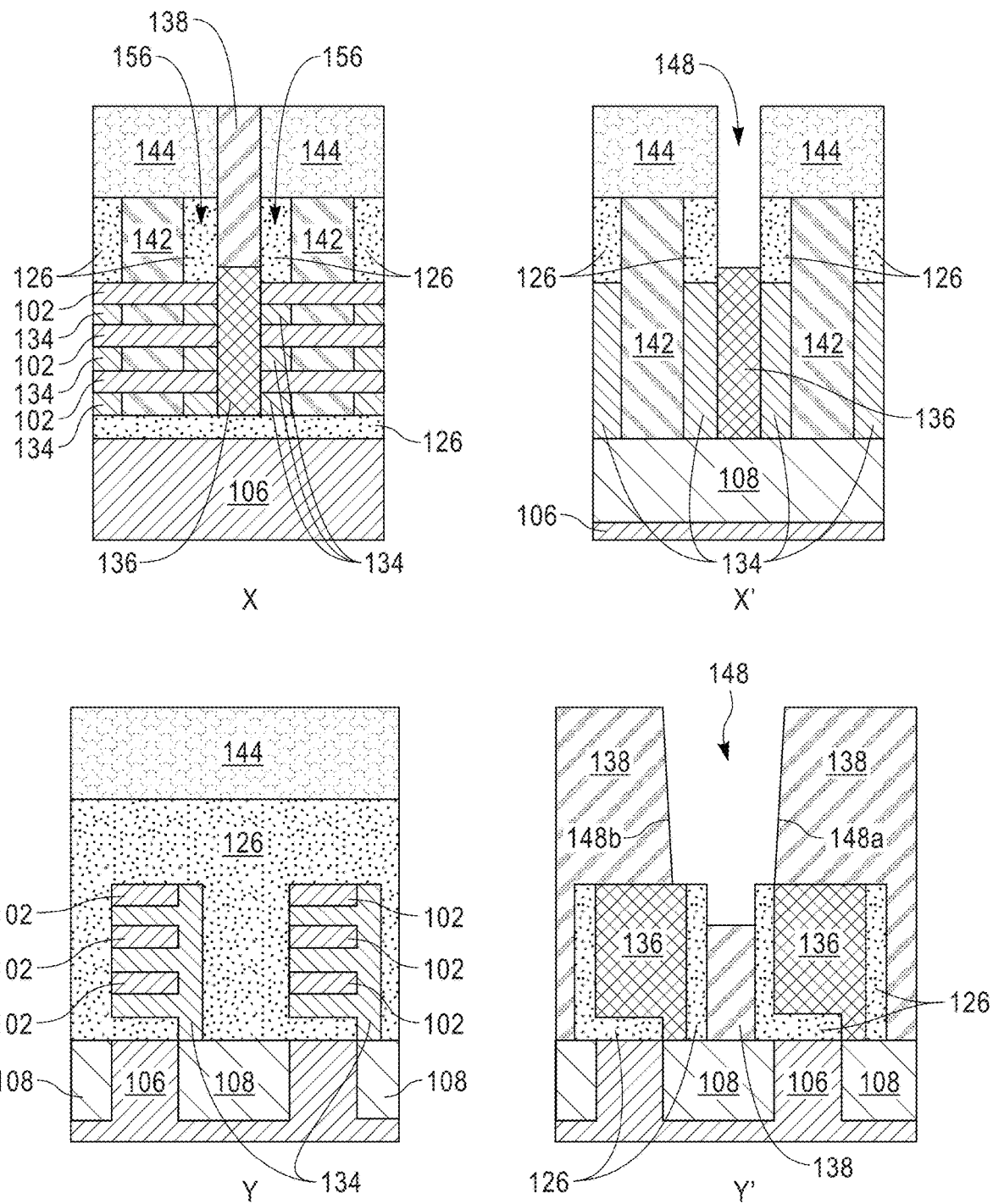

FIG. 12 depicts four cross-sectional side views of the nanosheet transistor 100 at the locations indicated in FIG. 4, with like reference numerals of previous figures referring to like features, and at a fabrication stage of the processing method that is subsequent to FIG. 11. FIG. 12 shows a contact cut 148 that defines regions where there are no S/D contacts in the ILD 138 over the epitaxial layer 136. The contact cut 148 may be completed using reactive-ion etching (RIE). The contact cut 148 etches the ILD 138 without etching the spacer dielectric 126 or the epitaxial layer 136. FIG. 12 purposefully shows that placement of the contact cut 148 can be not ideal (i.e., where some misalignment can happen during lithography process), such that the left edge of the contact cut lands over the epitaxial layer 136, while the right edge of the contact cut lands over the epi spacer dielectric 126. The embodiments disclosed herein enable air gaps to be formed under ideal contact cuts or misaligned cuts.

Figure 13:
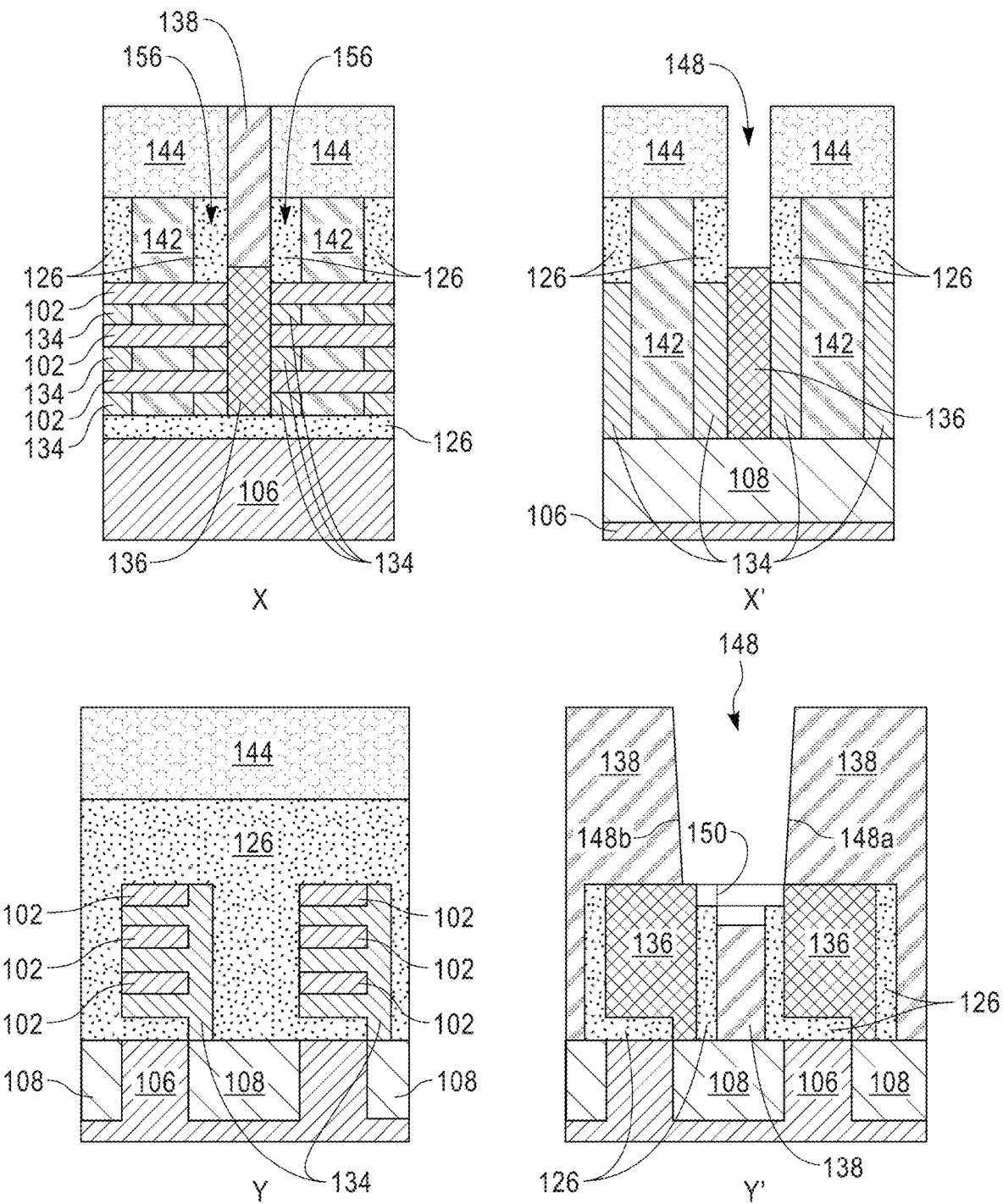

FIG. 13 depicts four cross-sectional side views of the nanosheet transistor 100 at the locations indicated in FIG. 4, with like reference numerals of previous figures referring to like features, and at a fabrication stage of the processing method that is subsequent to FIG. 12. FIG. 13 shows a spacer pulldown region 150, in which the spacer dielectric 126 is etched within the contact cut 148. The spacer pulldown region 150 exposes the epitaxial layer 136 in both the left and right edge of the contact cut regions.

Figure 14:
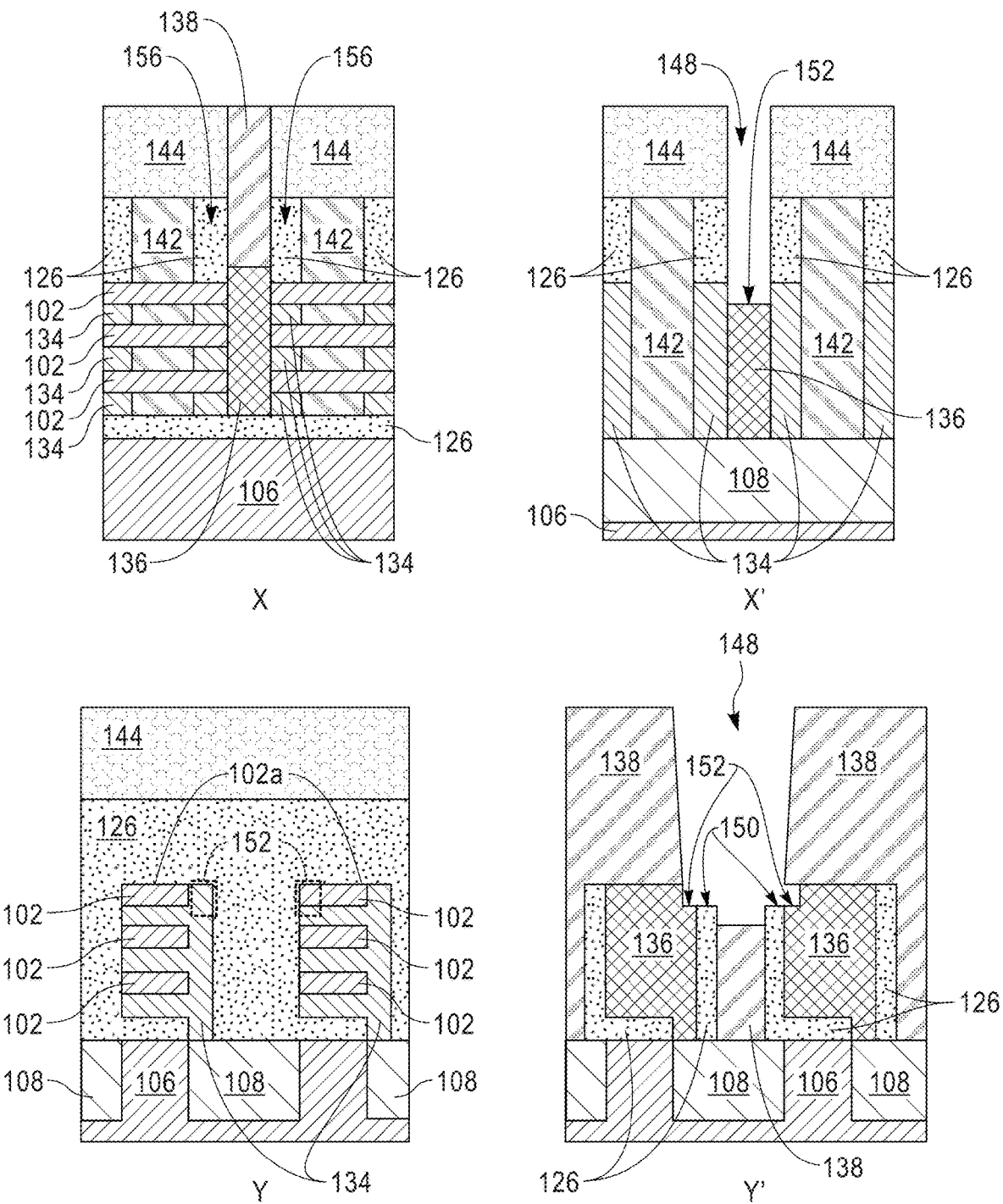

FIG. 14 depicts four cross-sectional side views of the nanosheet transistor 100 at the locations indicated in FIG. 4, with like reference numerals of previous figures referring to like features, and at a fabrication stage of the processing method that is subsequent to FIG. 13. FIG. 14 shows a corner etch 152 on the epitaxial layer 136. The corner etch 152 is located in the area that was exposed by the contact cut 148 and the spacer pulldown region 150. The corner etch 152 exposes the sacrificial inner spacer 134, as shown in subfigure X', and the spacer dielectric 126 is above a top nanosheet 102a as shown in subfigure Y.

Figure 15:
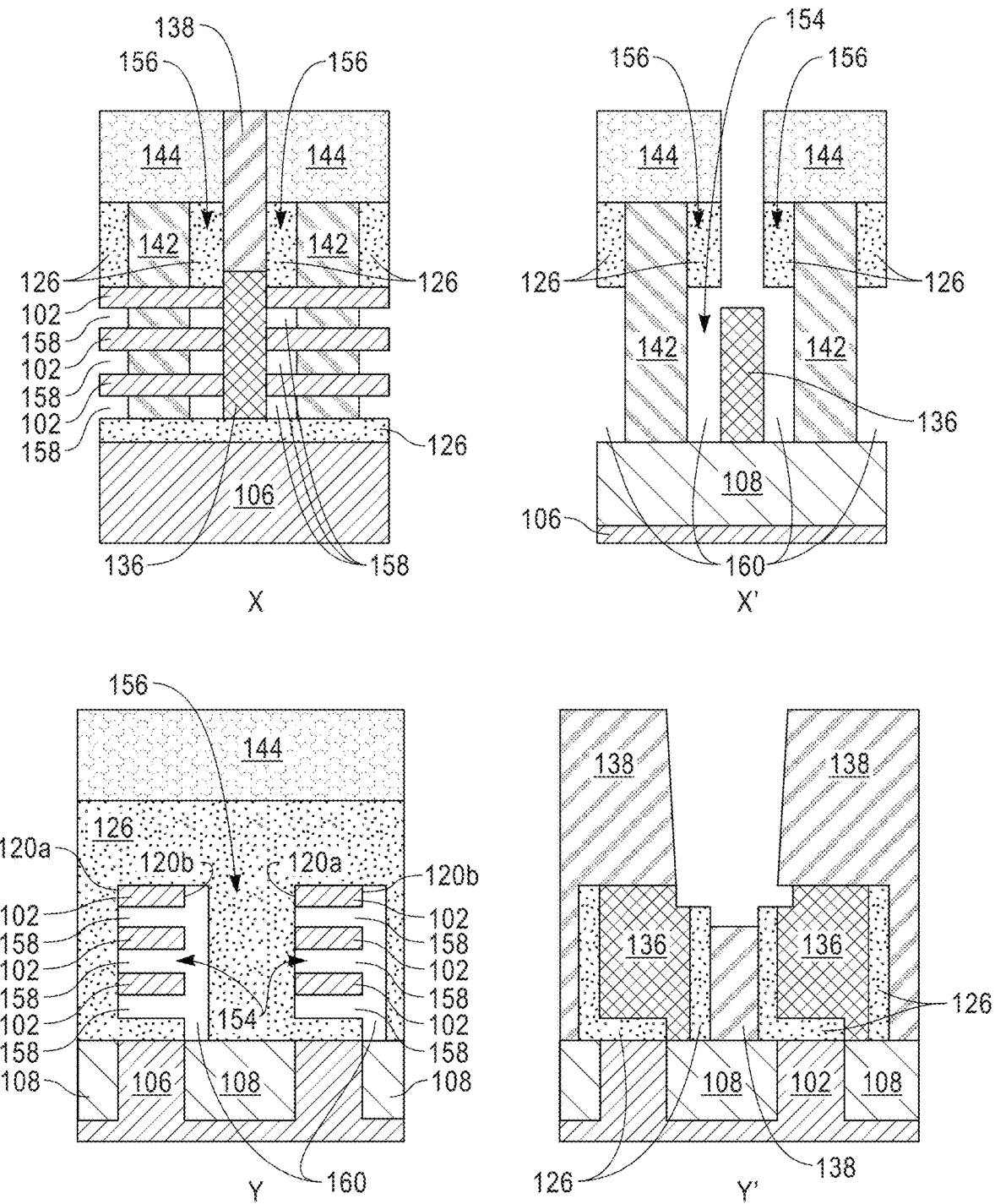

FIG. 15 depicts four cross-sectional side views of the nanosheet transistor 100 at the locations indicated in FIG. 4, with like reference numerals of previous figures referring to like features, and at a fabrication stage of the processing method that is subsequent to FIG. 14. FIG. 15 shows an air gap 154 in a spacer region 156 between the HKMG stack 142 and the epitaxial layer 136. The air gap 154 is formed when the sacrificial inner spacer 134 is cleanly etched from the nanosheet transistor 100. The sacrificial inner spacer 134 is made of a material that may be etched with minimal effect on the remainder of the nanosheet transistor 100. As mentioned with regard to FIG. 14, the etching of the sacrificial inner spacer 134 is enabled and completed through the corner etch 152 in the epitaxial layer 136. For example, a chemical etch that is reactive with the sacrificial inner spacer 134 contacts the sacrificial inner spacer 134 through the corner etch 152 and is allowed to continue etching until the entirety of the sacrificial inner spacer 134 is removed. The air gap 154 thus includes an inner spacer region 158 between the nanosheets 102, the inner spacer region 158 may include the entire width of the nanosheets 102 from the first edge 120a to the second edge 120b, such that the inner spacer region consists of only the air gap 154. The air gap 154 may also include a side subway region 160 along the second edge 120b of the nanosheets 102 and the inner spacer region 158.

Figure 16:
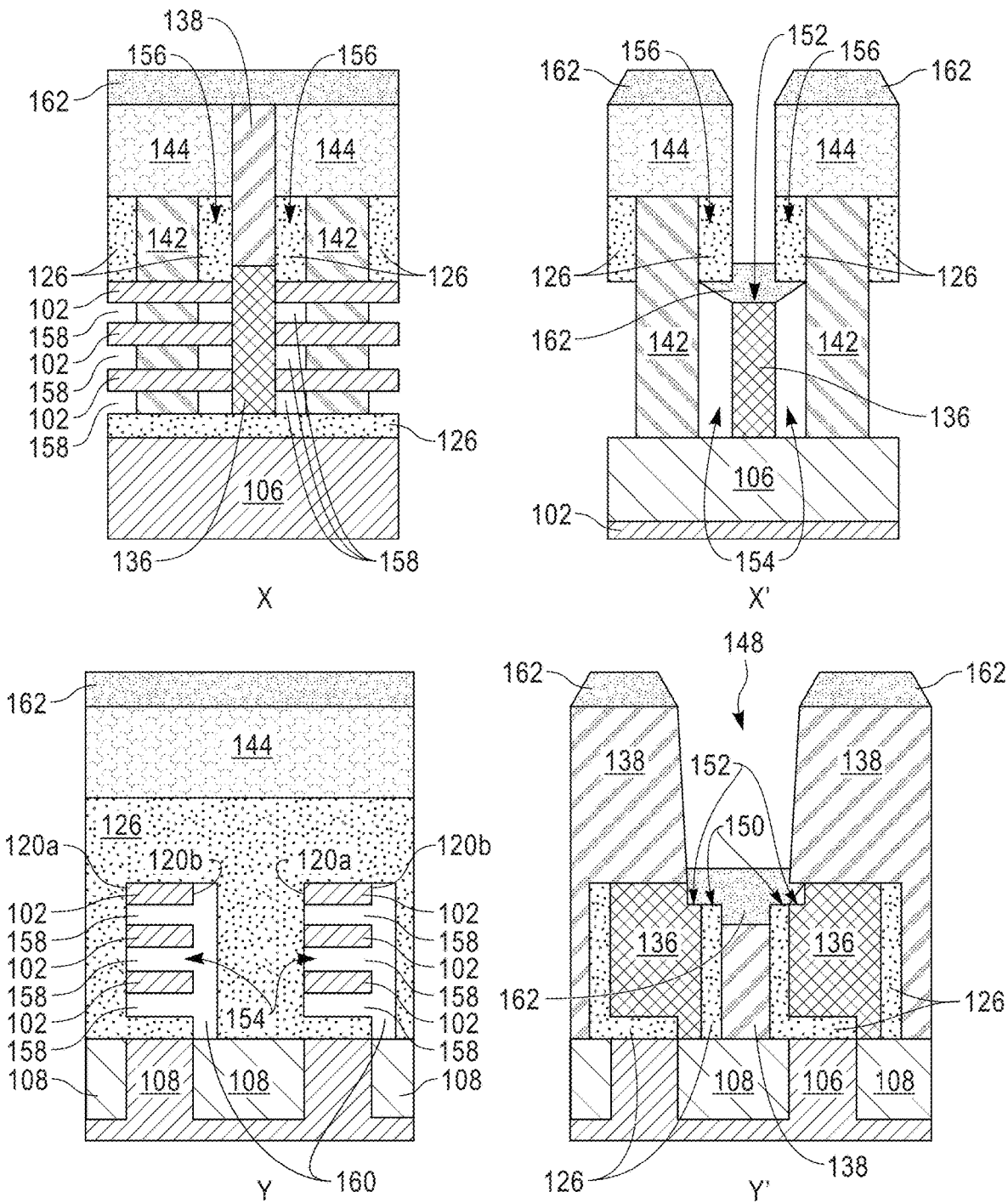

FIG. 16 depicts four cross-sectional side views of the nanosheet transistor 100 at the locations indicated in FIG. 4, with like reference numerals of previous figures referring to like features, and at a fabrication stage of the processing method that is subsequent to FIG. 15. FIG. 16 shows a non-formal dielectric deposition 162, such as silicon nitride fill that closes off the corner etch 152 and the spacer pulldown region 150 so that the air gap 154 is no longer exposed. As illustrated, the non-formal dielectric deposition 162 does not flow into the air gap 154, but merely fills in the corner etch 152 and the spacer pulldown region 150. The air gap 154 realizes completion, therefore, after the growth of the epitaxial layer 136, which reduces the likelihood that any epitaxial growth will negatively contribute to parasitic capacitance in the nanosheet transistor 100. One example of formation of the non-formal dielectric deposition 162 may be using a high-density plasma (HDP) deposition.

Figure 17:
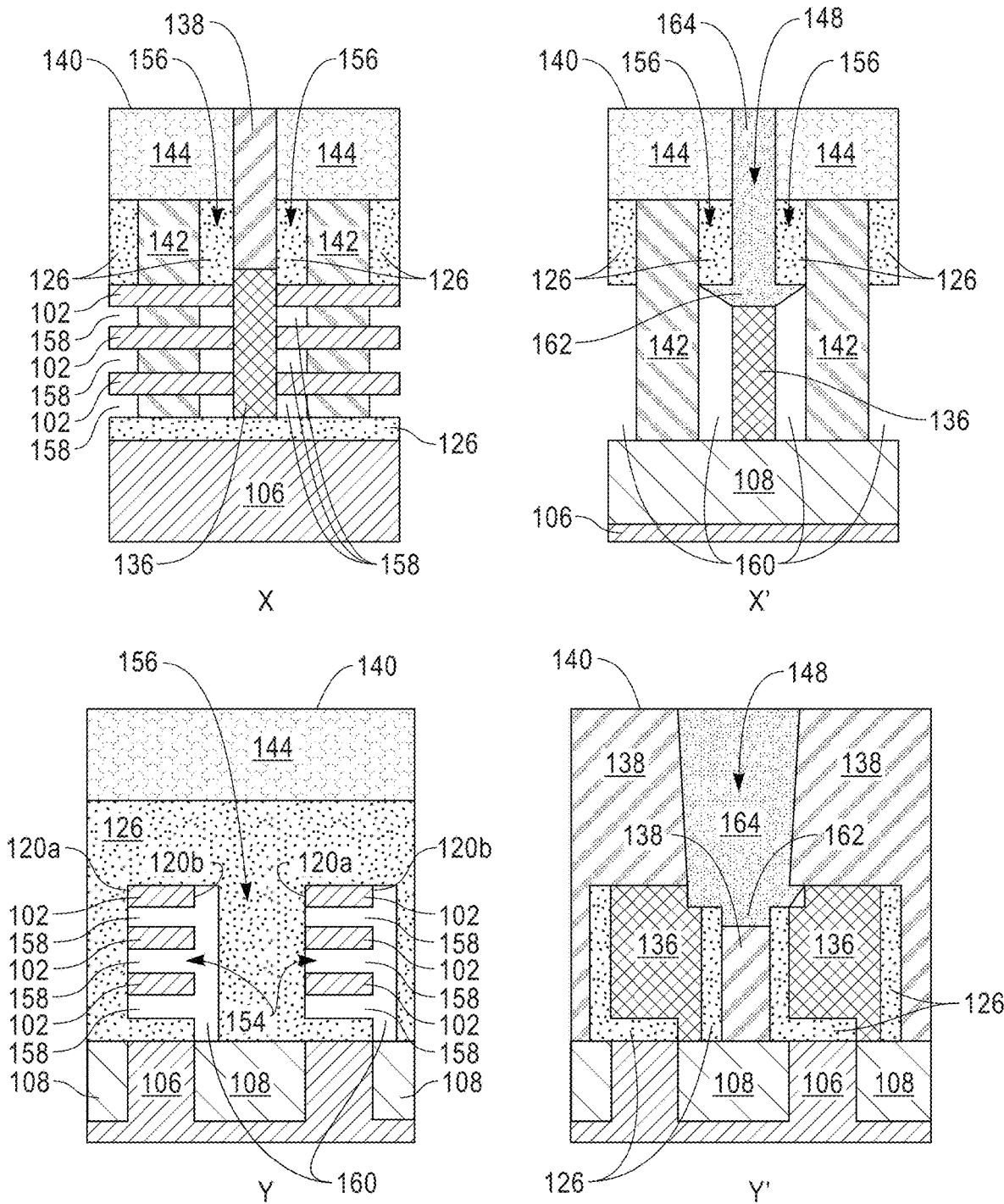

FIG. 17 depicts four cross-sectional side views of the nanosheet transistor 100 at the locations indicated in FIG. 4, with like reference numerals of previous figures referring to like features, and at a fabrication stage of the processing method that is subsequent to FIG. 16. FIG. 17 shows a dielectric deposition overfill 164 that has filled the contact cut 148 up to the SAC cap surface 140. The nanosheet transistor 100 may than be planarized back to the SAC cap surface 140. The contact cut 148 may be filled, for example, using a chemical vapor deposition technique.

Figure 18:
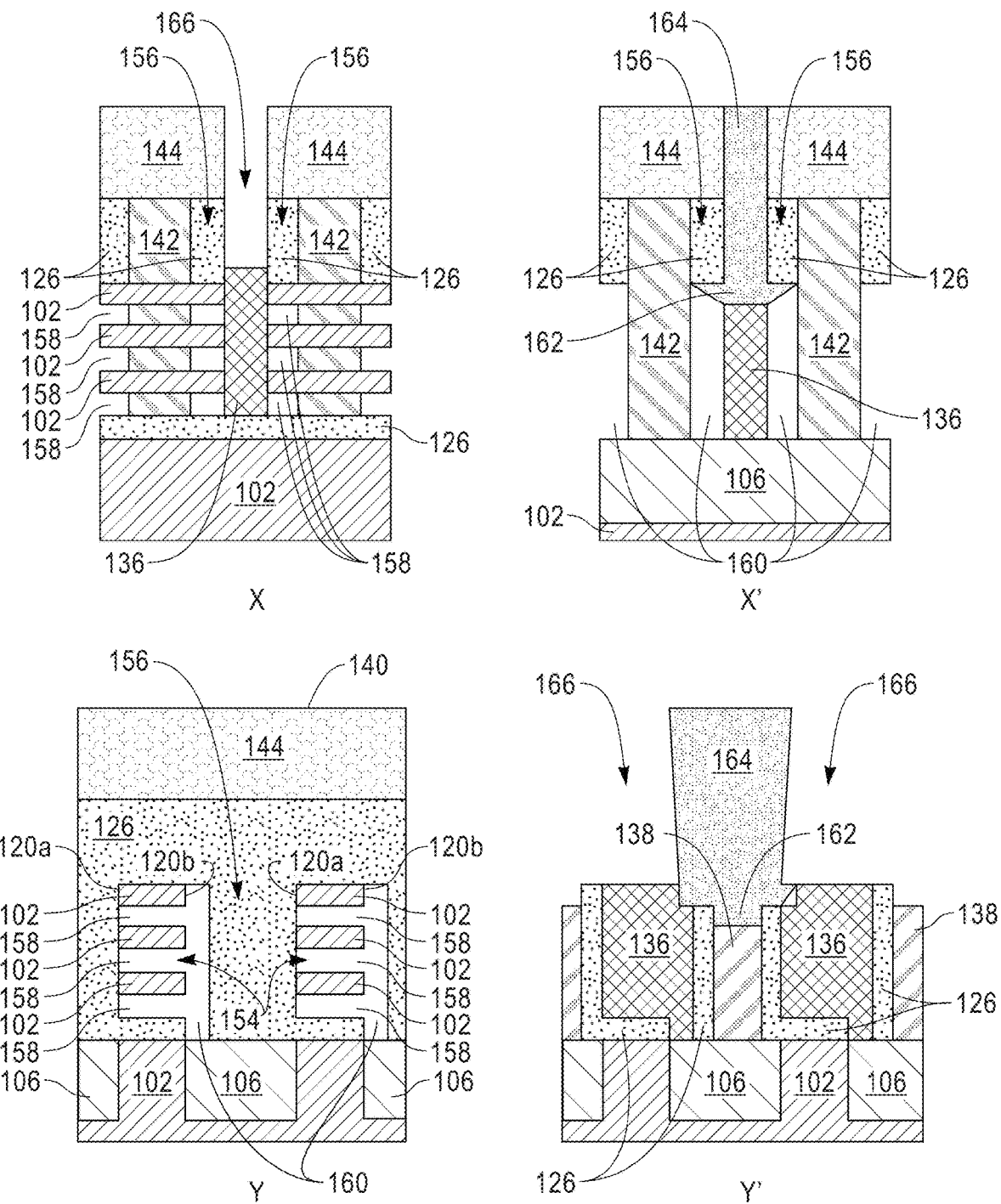

FIG. 18 depicts four cross-sectional side views of the nanosheet transistor 100 at the locations indicated in FIG. 4, with like reference numerals of previous figures referring to like features, and at a fabrication stage of the processing method that is subsequent to FIG. 17. FIG. 18 shows an etch back of the ILD 138 from a trench area 166. The ILD 138 is cleanly etched back without etching the spacer dielectric 126, the sacrificial cap 144, the epitaxial layer 136, or the dielectric deposition overfill 164.

Figure 19:
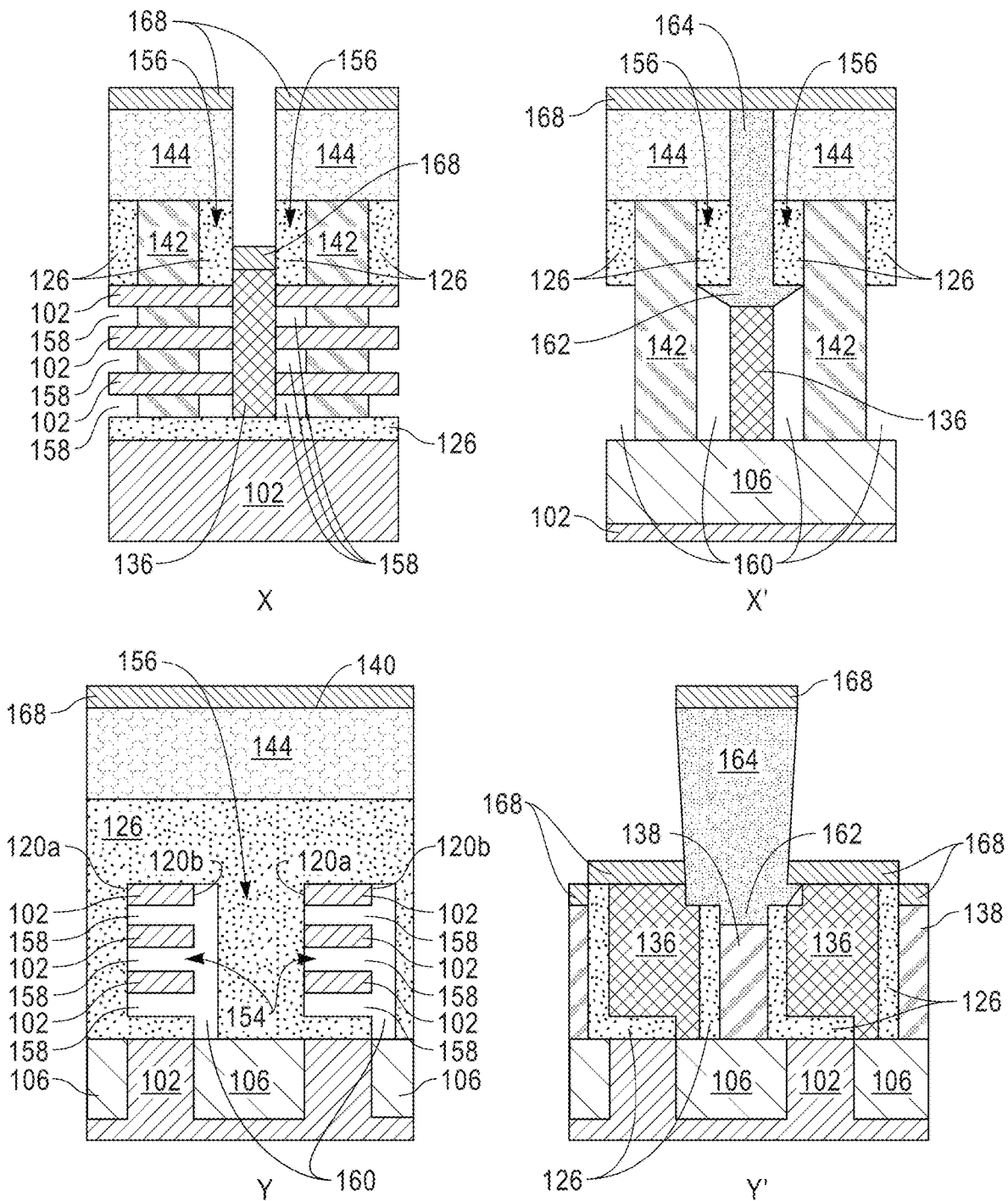

FIG. 19 depicts four cross-sectional side views of the nanosheet transistor 100 at the locations indicated in FIG. 4, with like reference numerals of previous figures referring to like features, and at a fabrication stage of the processing method that is subsequent to FIG. 18. FIG. 19 shows a metal liner deposition 168 for silicide formation. One example of metal liner could be titanium deposited by radio frequency physical vapor deposition (RFPVD).

Figure 20:
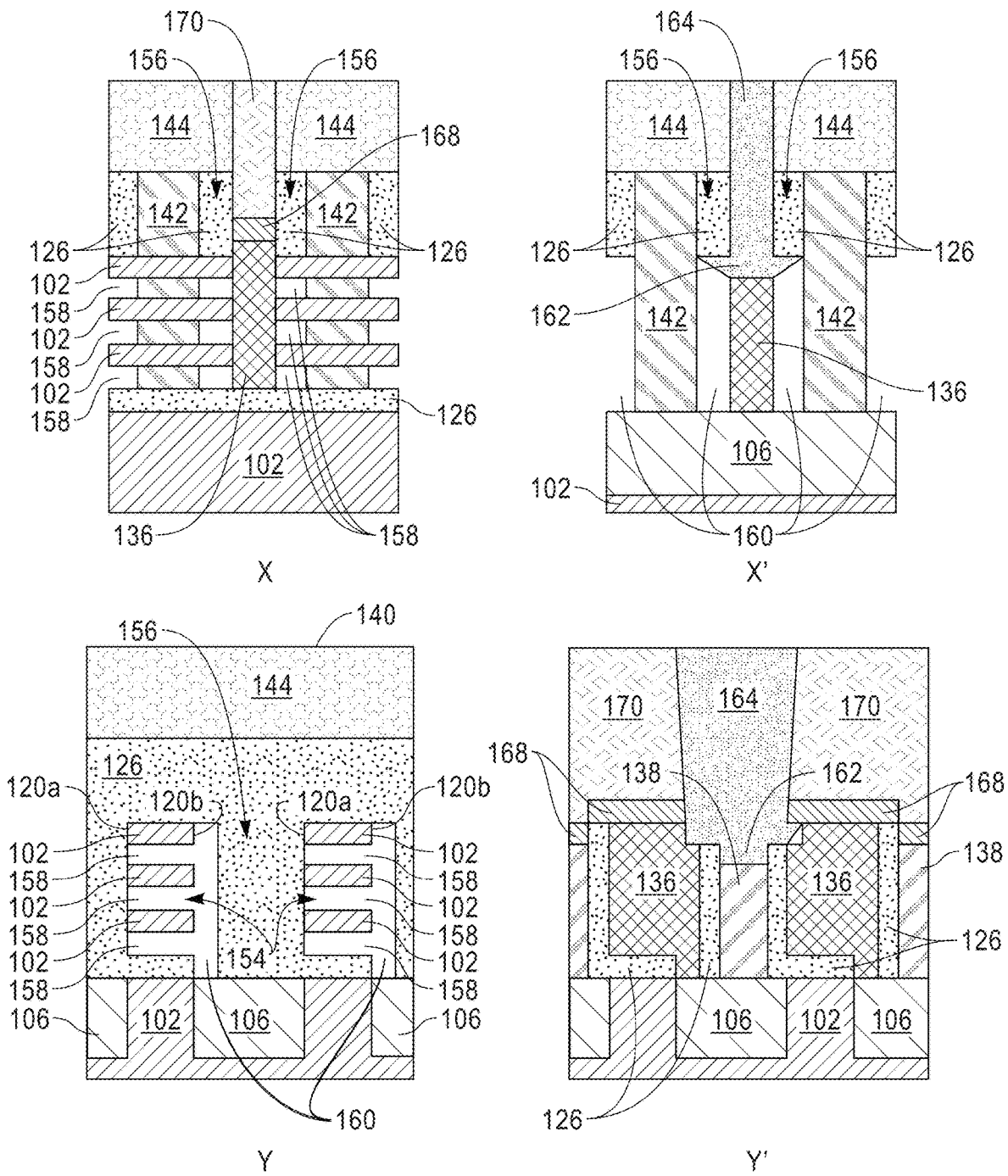

FIG. 20 depicts four cross-sectional side views of the nanosheet transistor 100 at the locations indicated in FIG. 4, with like reference numerals of previous figures referring to like features, and at a fabrication stage of the processing method that is subsequent to FIG. 19. FIG. 20 shows the trench area 166 filled in with a trench contact 170 around the dielectric deposition overfill 164, so that the nanosheet transistor 100 is ready for operation. In operation, the nanosheet transistor 100 will have less parasitic capacitance due to the spacer region 156 that is between the HKMG stack 142 and the epitaxial layer 136. The spacer region 156 includes nanosheet stacks 105 made of nanosheets 102. Between the nanosheets 102, the stacks 105 include the inner spacer regions 158 and the side subway region 160. The side subway region 160 is located along the second edge 120b of the nanosheets 102 and the inner spacer region 158.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A nanosheet transistor for reducing parasitic capacitance, comprising:
 a spacer region between a high-k metal gate and an epitaxial layer, wherein the spacer region comprises:
  a first nanosheet stack comprising a first nanosheet and a second nanosheet;
  an inner spacer region between the first nanosheet and the second nanosheet; and
  a side subway region located along an edge of the first nanosheet, the inner spacer region, and the second nanosheet, wherein the side subway region contacts a shallow trench isolation below the spacer region.

2. The nanosheet transistor of claim 1, wherein the inner spacer region consists of an air gap.

3. The nanosheet transistor of claim 2, further comprising a non-formal dielectric deposition closing off the air gap.

4. The nanosheet transistor of claim 1, wherein the spacer region comprises a dielectric above the first nanosheet.

5. The nanosheet transistor of claim 1, wherein the spacer region comprises:
 a second nanosheet stack between the high-k metal gate and the epitaxial layer; and
 a spacer dielectric between the first nanosheet stack and the second nanosheet stack.

6. The nanosheet transistor of claim 5, wherein the side subway region is located between the first stack and the spacer dielectric.

7. The nanosheet transistor of claim 1, wherein the side subway region comprises an air gap.

8. A method of fabricating a nanosheet transistor, comprising:
 forming a nanosheet stack comprising sacrificial inner spacers and nanosheets;
 forming an epitaxial layer adjacent to the nanosheet stack;
 indenting the epitaxial layer to expose the sacrificial inner spacer at a corner etch; and
 removing the sacrificial inner spacer to form an air gap around the nanosheets.

9. The method of claim 8, comprising:
 cutting a contact cut through an interlayer dielectric layer; and
 etching a spacer within the contact cut to expose the epitaxial layer.

10. The method of claim 8, comprising forming a spacer between the nanosheet stack and a substrate.

11. The method of claim 8, wherein the air gap comprises a side subway region along an edge of the nanosheets.

12. The method of claim 8, comprising filling the corner etch with a non-formal dielectric deposition.

13. The method of claim 12, comprising forming a trench contact around the non-formal dielectric deposition.

14. The method of claim 8, wherein removing the sacrificial inner spacer comprises etching the sacrificial inner spacer through the corner etch.

15. A nanosheet transistor for reducing parasitic capacitance, comprising:

a spacer region between a high-k metal gate and an epitaxial layer, wherein the spacer region comprises:
  a first nanosheet stack comprising a first nanosheet and a second nanosheet;
  an inner spacer region between the first nanosheet and the second nanosheet, wherein the inner spacer region comprises an air gap over a width of the first nanosheet and the second nanosheet, wherein the air gap contacts a shallow trench isolation below the first nanosheet stack.

16. The nanosheet transistor of claim 15, wherein the spacer region comprises a side subway region located along an edge of the first nanosheet, the inner spacer region, and the second nanosheet.

17. The nanosheet transistor of claim 16, wherein the side subway region comprises a side subway region air gap.

18. The nanosheet transistor of claim 15, further comprising a non-formal dielectric deposition closing off the air gap.

19. The nanosheet transistor of claim 15, wherein the spacer region comprises:
  a second nanosheet stack between the high-k metal gate and the epitaxial layer; and
  a spacer dielectric between the first nanosheet stack and the second nanosheet stack.

20. The nanosheet transistor of claim 19, comprising a side subway region located between the first stack and the spacer dielectric.

* * * * *